US012775034B2

(12) United States Patent
Van Hoogdalem et al.

(10) Patent No.: US 12,775,034 B2
(45) Date of Patent: Oct. 27, 2026

(54) DETERMINING LOCALIZATION LENGTHS IN HYBRID SUPERCONDUCTOR-SEMICONDUCTOR DEVICES USING MULTIPLE FISHBONE STRUCTURES HAVING HYBRID WIRES

(71) Applicant: Microsoft Technology Licensing, LLC, Redmond, WA (US)

(72) Inventors: Kevin Alexander Van Hoogdalem, Alphen aan den Rijn (NL); Tom Marijn Laeven, Delft (NL); Léo Robin Bourdet, Delft (NL); Roman Mykolayovych Lutchyn, Santa Barbara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 101 days.

(21) Appl. No.: 18/964,957

(22) Filed: Dec. 2, 2024

(65) Prior Publication Data

US 2026/0153544 A1 Jun. 4, 2026

(51) Int. Cl.

*G01R 27/02* (2006.01)
*H10N 60/82* (2023.01)
*H10N 60/83* (2023.01)

(52) U.S. Cl.

CPC ............. *G01R 27/02* (2013.01); *H10N 60/82* (2023.02); *H10N 60/83* (2023.02)

(58) Field of Classification Search

CPC ......... G01R 27/02; H01N 60/82; H01N 60/83
See application file for complete search history.

(56) References Cited

U.S. PATENT DOCUMENTS

| | | | | |
|---|---|---|---|---|
| 10,490,600 | B2 * | 11/2019 | Freedman | G06N 10/20 |
| 11,903,330 | B2 * | 2/2024 | Shabani | G06N 10/40 |
| 12,405,101 | B2 * | 9/2025 | O'Farrell | G01B 7/02 |

OTHER PUBLICATIONS

Extended European Search Report Received in European Patent Application No. 25216330.8 mailed on Apr. 29, 2026, 06 pages.

* cited by examiner

*Primary Examiner* — Gregory H Curran
(74) *Attorney, Agent, or Firm* — Ranjeev Singh; Singh Law, PLLC

(57) ABSTRACT

Devices, methods, and systems for determining localization lengths in hybrid superconductor-semiconductor devices using multiple fishbone structures having hybrid wires are described. An example method includes, using a measurement system coupled to a first fishbone structure, obtaining a first set of nonlocal conductance values associated with each of a first set of hybrid wires by selectively supplying voltages to a first set of gates associated with the first fishbone structure. The method further includes using the measurement system coupled to a second fishbone structure, obtaining a second set of nonlocal conductance values associated with each of the second set of hybrid wires by selectively supplying voltages to a second set of gates associated with a second fishbone structure. The method further includes determining the localization length associated with the hybrid superconductor-semiconductor device based on both the first set of nonlocal conductance values and the second set of nonlocal conductance values.

20 Claims, 11 Drawing Sheets

300

500

600

700

800

900

1000

1100

DETERMINING LOCALIZATION LENGTHS IN HYBRID SUPERCONDUCTOR-SEMICONDUCTOR DEVICES USING MULTIPLE FISHBONE STRUCTURES HAVING HYBRID WIRES

BACKGROUND

Hybrid superconductor-semiconductor devices having superconducting wires can have segments with one of two phases: a trivial phase or a topological phase. Such devices are optimized to produce a large topological gap. To achieve the large topological gap, the semiconductor stack in such devices needs to produce a large spin-orbit coupling in the confined two-dimensional gas (2DEG). Disorder in the bulk of such superconducting wires suppresses the topological gap and increases the coherence length. This, in turn, leads to a minimum length requirement for the superconducting wire to perform well as a part of a qubit that depends on the composition/geometry of the stack of layers used to form the wire and manage the disorder level.

In such hybrid superconductor-semiconductor devices, localization length is a parameter that determines the statistical dependence of conductance on the length of the superconducting wire in the device. The conductance is measured as a function of the wire length. Traditionally, a single wire (or a small number of wires) for each of different wire lengths has been used to determine the conductance. Measurements using the small number of wires results in a large amount of uncertainty with respect to the statistical estimate of the localization length. Additionally, using a single wire design, while the chemical potential in the superconducting wire can be determined, separate types of measurements need to be performed. Accordingly, there is a need for improved devices and methods for determining localization lengths.

SUMMARY

In one example, the present disclosure relates to a hybrid superconductor-semiconductor device comprising a first fishbone structure comprising a first superconducting backbone arranged in a first direction and a first set of hybrid wires arranged in a second direction, perpendicular to the first direction, where each of the first set of hybrid wires has a same first length in the second direction. The hybrid superconductor-semiconductor device further includes a second fishbone structure comprising a second superconducting backbone arranged in the first direction and a second set of hybrid wires arranged in the second direction, where each of the second set of hybrid wires has a same second length, different from the first length, in the second direction.

The hybrid superconductor-semiconductor device further includes a measurement system to: (1) obtain a first set of nonlocal conductance values associated with each of the first set of hybrid wires by selectively supplying voltages to a first set of gates associated with the first fishbone structure, and (2) obtain a second set of nonlocal conductance values associated with each of the second set of hybrid wires by selectively supplying voltages to a second set of gates associated with the second fishbone structure.

In another example, the present disclosure relates to a method for determining a localization length of a hybrid superconductor-semiconductor device. The hybrid superconductor-semiconductor device comprises: (1) a first fishbone structure comprising a first superconducting backbone arranged in a first direction and a first set of hybrid wires arranged in a second direction, perpendicular to the first direction, where each of the first set of hybrid wires has a same first length in the second direction, and (2) a second fishbone structure comprising a second superconducting backbone arranged in the first direction and a second set of hybrid wires arranged in the second direction, where each of the second set of hybrid wires has a same second length, different from the first length, in the second direction.

The method includes using a measurement system coupled to the first fishbone structure, obtaining a first set of nonlocal conductance values associated with each of the first set of hybrid wires by selectively supplying voltages to a first set of gates associated with the first fishbone structure. The method further includes using the measurement system coupled to the second fishbone structure, obtaining a second set of nonlocal conductance values associated with each of the second set of hybrid wires by selectively supplying voltages to a second set of gates associated with the second fishbone structure. The method further includes determining the localization length associated with the hybrid superconductor-semiconductor device based on both the first set of nonlocal conductance values and the second set of nonlocal conductance values.

In yet another example, the present disclosure relates to a hybrid superconductor-semiconductor device comprising a first fishbone structure comprising a first superconducting backbone arranged in a first direction and a first set of hybrid wires arranged in a second direction, perpendicular to the first direction, where each of the first set of hybrid wires has a same first length in the second direction. The hybrid superconductor-semiconductor device further includes a second fishbone structure comprising a second superconducting backbone arranged in the first direction and a second set of hybrid wires arranged in the second direction, where each of the second set of hybrid wires has a same second length, different from the first length, in the second direction.

The hybrid superconductor-semiconductor device further includes a third fishbone structure comprising a third superconducting backbone arranged in the first direction and a third set of hybrid wires arranged in the second direction, where each of the third set of hybrid wires has a same third length, different from each of the first length and the second length, in the second direction. The hybrid superconductor-semiconductor device further includes a fourth fishbone structure comprising a fourth superconducting backbone arranged in the first direction and a fourth set of hybrid wires arranged in the second direction, where each of the fourth set of hybrid wires has a same fourth length, different from each of the first length, the second length, and the third length, in the second direction.

The hybrid superconductor-semiconductor device further includes a measurement system to: (1) obtain a first set of nonlocal conductance values associated with each of the first set of hybrid wires associated with the first fishbone structure, (2) obtain a second set of nonlocal conductance values associated with each of the second set of hybrid wires associated with the second fishbone structure, (3) obtain a third set of nonlocal conductance values associated with each of the third set of hybrid wires associated with the third fishbone structure, and (4) obtain a fourth set of nonlocal conductance values associated with each of the fourth set of hybrid wires associated with the fourth fishbone structure.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
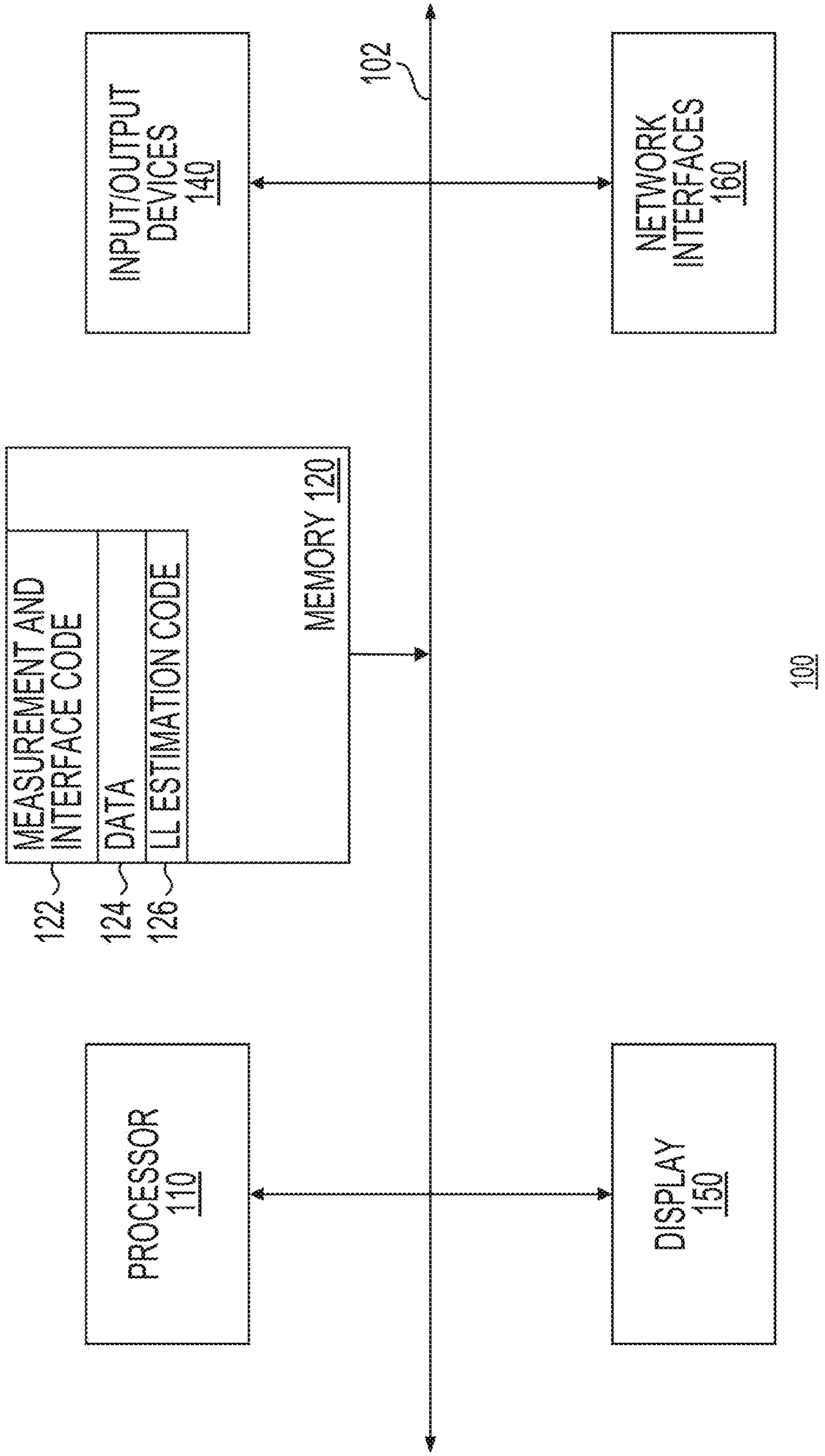
FIG. 1 is a block diagram of a computing system for determining localization lengths in hybrid superconductor-semiconductor devices using fishbone structures including hybrid wires in accordance with one example.

Examples in the present disclosure relate to devices, methods, and systems for determining localization lengths in hybrid superconductor-semiconductor devices using multiple fishbone structures having hybrid wires. As noted earlier, hybrid superconductor-semiconductor devices with hybrid wires can have segments with one of two phases: a trivial phase or a topological phase. Such topological hybrid superconductor-semiconductor devices are optimized to produce a large topological gap. To achieve the large topological gap, the semiconductor stack in such devices needs to produce a large spin-orbit coupling in the confined two-dimensional gas (2DEG). Disorder in the bulk of such hybrid wires suppresses the topological gap and increases the coherence length. This, in turn, leads to a minimum length requirement for the superconducting wire to perform well as a part of a qubit that depends on the composition/geometry of the stack of layers used to form the wire and the disorder level.

Hybrid superconductor-semiconductor devices include multiple hybrid wires, which can be implemented by a superconductor strip (e.g., an aluminum strip) separated from a quantum well (e.g., an Indium-arsenide (InAs) quantum well) by a barrier layer. The superconductor-semiconductor heterostructure is separated from electrostatic gates by a barrier layer. The electrostatic gates can include gates, such as plunger gates, cutter gates, and helper gates. Broadly speaking, the plunger gates serve to deplete the 2DEG on their side of the superconducting wire, while the cutter gates can be used to deplete the 2DEG further. After the 2DEG has been depleted, the helper gates and the plunger gates can be used to perform additional measurements with the application of an in-plane magnetic field. The superconducting coherence length in a nanowire within such a hybrid superconductor-semiconductor device can be viewed as a distance that a zero-energy unpaired electron can penetrate into the proximitized nanowire. In the topological phase, the superconducting coherence length corresponds to the topological coherence length of a Majorana zero mode (MZM).

The MZMs are formed at the boundaries between semiconducting wires and superconducting wires. Under conditions in which the localization length ($l_{loc}$) is much shorter than the length of the semiconducting wire, an MZM does not form at the boundary between the semiconducting wire and the superconducting wire. MZM formation requires the localization length ($l_{loc}$) within the semiconducting wire to be greater than the topological coherence length of the semiconductor. In addition, increasing the localization length ($l_{loc}$) of the semiconductor leads to a reduction in the topological coherence length, and a shorter topological coherence length may allow for smaller device sizes. Thus, measurements of the localization length ($l_{loc}$) may be used to evaluate the performance of a topological quantum computing device, including hybrid wires. As an example, the localization length ($l_{loc}$) of the semiconducting wire may be measured during the process of developing the topological quantum computing device. The localization length ($l_{loc}$) may be extracted as part of a quality control test during quantum computing device manufacturing. For an electrically conducting wire in the localized regime, conductance scales with the wire length L and the localization length ($l_{loc}$); according to $\exp(-2L/l_{loc};)$. This scaling can be used to experimentally extract the localization length ($l_{loc}$) by measuring the conductance in a series of wires with varying lengths. Exponential curve-fitting may then be used to estimate the localization length ($l_{loc}$).

In other words, in such hybrid superconductor-semiconductor devices, the localization length ($l_{loc}$) can also be viewed as a parameter that determines the statistical dependence of conductance on the length of the device. Localization length can be viewed as a measure of the amount of disorder or scattering in a hybrid superconductor-semiconductor device. The devices and methods described herein can be used for accurately estimating localization lengths in hybrid superconductor-semiconductor devices.

The hybrid mobility protocol can be used to characterize the amount of disorder in a device. To characterize the amount of disorder, one can measure the nonlocal conductance values in several wires of varying length L. Theory predicts that the nonlocal conductance decreases exponentially with $L/l_{loc}$, where the localization length ($l_{loc}$) is a metric for the disorder in the system. This measurement can be performed as a function of chemical potential (plunger voltage) to further characterize the disorder. Current designs for performing such measurements have several downsides. First, the current designs contain a limited number of wires, which results in a large uncertainty in the estimate of the localization length. Second, in the current designs one cannot independently determine the chemical potential in the wire. This, in turn, severely complicates the interpretation of the measurements.

Examples described herein relate to a hybrid mobility protocol (HYM) fishbone design that solves these issues and provides additional benefits. FIG. 1 is a block diagram of a computing system 100 for determining localization lengths in hybrid superconductor-semiconductor devices using fishbone structures, including hybrid wires, in accordance with one example. Computing system 100 includes a processor 110, a memory 120, input/output devices 140, display 150, and network interfaces 160 interconnected via bus system 102. Memory 120 may include measurement and interface code 122, data 124 (including measurement data, synthetic data, or other types of data used as part of the methods described herein), and the localization length (LL) estimation code 126. Measurement and interface code 122 may include program instructions that, when executed by processor 110, allow computing system 100 to enable the performance of the methods described herein, including the steps associated with the hybrid mobility protocol. In addition, measurement and interface code 122 may include libraries or other code for allowing processor 110 to display relevant information on display 150. Measurement and interface code 122 may also allow input/output devices 140 to receive or transmit information associated with the methods described herein. As an example, computing system 100 may access data concerning hybrid superconductor-semiconductor devices via input/output devices 140 with the help of the execution of the measurement and interface code 122. Measurement and interface code 122 may also operate in conjunction with an experimental set up to allow a user to control the various knobs (e.g., plunger voltage or other voltages) associated with the measurement of the nonlocal conductance values and measurement of local conductance values to determine the sub-band transitions.

LL estimation code 126 may include instructions for executing steps described with respect to the various methods described herein. As an example, LL estimation code 126 may include software libraries and other code for processing the measurement data, extracting localization lengths, and estimating the localization lengths. Statistical estimation techniques, including maximum likelihood estimation and Bayesian estimation, may be used. Localization lengths may be estimated using curve-fitting techniques. As an example, fit parameters can be obtained by linear fit of $\ln(-G_{RL})$ vs. L with another variable describing the quality of the fit. The extracted localization lengths ($l_{loc}$) can be viewed as a function of the plunger voltage with the quality of the fit captured by another variable. Alternatively, during fitting the data to the expected value of the conductance, conductance $((-G_{RL})=A\exp(-2L/l_{loc}))$ can also be used.

In addition, statistical predictive model(s) (including machine learning (ML) model(s)) relating the conductance (local and nonlocal) values to the localization length can also be used. The ML model(s) can be trained based on the measured and/or simulated data for a large collection of models of hybrid superconductor-semiconductor devices with hybrid wires. Various machine learning techniques can be used to train the ML model(s). In one example, ML model(s) may be trained to perform regression analysis. Appropriate supervised machine learning techniques for regression analysis include Artificial Neural Networks, Support Vector Machines, k-Nearest Neighbors (k-NN), and linear regression. Although FIG. 1 shows a certain number of components of computing system 100 arranged in a certain way, additional or fewer components arranged differently may also be used. In addition, although memory 120 shows certain blocks of code, the functionality provided by this code may be combined or distributed. In addition, the various blocks of code may be stored in non-transitory computer-readable media, such as non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as DRAM, SRAM, a cache, or other such media.

Figure 2:
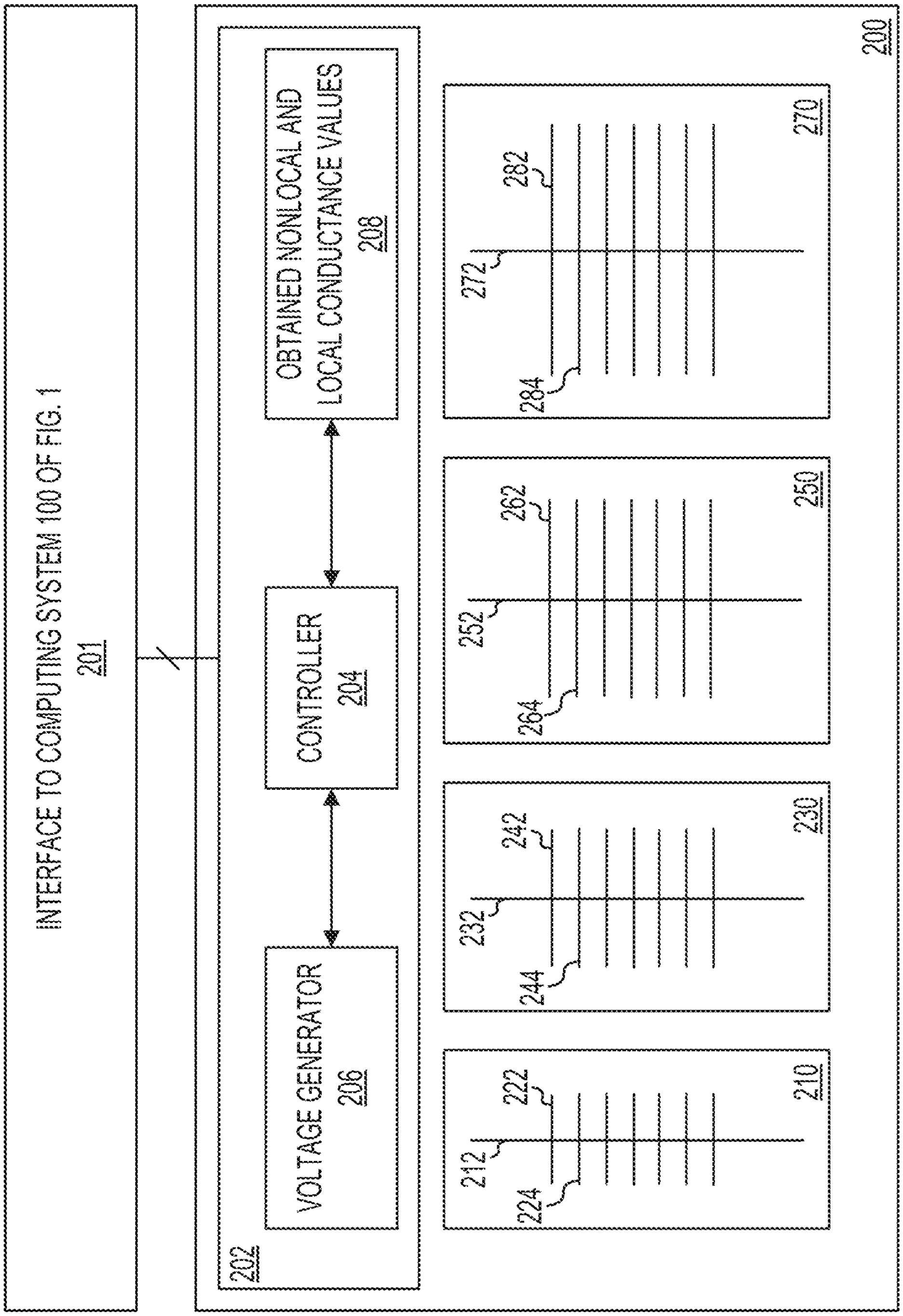
FIG. 2 is a diagram of an example hybrid superconductor-semiconductor device with four fishbone structures, including hybrid wires, in the same device in accordance with one example.

FIG. 2 shows an example hybrid superconductor-semiconductor device 200 with four fishbone structures, including hybrid wires, in the same device in accordance with one example. Hybrid superconductor-semiconductor device 200 may be a device under test or any other device formed as a single integrated circuit using semiconductor/superconductor fabrication techniques. Hybrid superconductor-semiconductor device 200 is coupled via an interface 201 to the computing system 100 of FIG. 1. Interface 201 can include components such as cooling systems (including dilution refrigerators) and niobium (or similar) wires for allowing the transfer of signals between computing system 100 and hybrid superconductor-semiconductor device 200.

In this example, hybrid superconductor-semiconductor device 200 includes a measurement system 202 for measuring the nonlocal conductance values of hybrid wires included within the hybrid superconductor-semiconductor device 200. Measurement system 202 includes a controller 204, a gate voltage generator 206, and a storage (or a communication set up) to store and/or communicate the obtained nonlocal conductance values and/or local conductance values 208 to interface 201. Controller 204 includes logic and circuitry to respond to instructions received via interface 201 and generate control signals for the measurement of the nonlocal conductance values. Controller 204 may also include oscillators, switches, finite state machines, and a memory. As an example, the memory may be implemented as one or more multi-bit registers for allowing scan-patterns and pulse-patterns to be stored. The control signals are coupled to voltage generator 206 to allow for the generation and application of the appropriate gate and bias voltages to the hybrid wires associated with the fishbone structures included within the hybrid superconductor-semiconductor device 200.

With continued reference to FIG. 2, the four fishbone structures include fishbone structure 210, fishbone structure 230, fishbone structure 250, and fishbone structure 270. Each fishbone structure comprises a superconducting backbone and parallel hybrid wires of the same length. The different fishbone structures have wires of different length. Thus, in this example, fishbone structure 210 includes a superconducting backbone 212 and seven parallel hybrid wires (e.g., hybrid wires 222 and 224). Each of these wires has a length of L1 (in one example, L1 is 3.5 microns). Fishbone structure 230 includes a superconducting backbone 232 and seven parallel hybrid wires (e.g., hybrid wires 242 and 244). Each of these wires has a length of L2 (in one example, L2 is 2.75 microns). Fishbone structure 250 includes a superconducting backbone 252 and seven parallel hybrid wires (e.g., hybrid wires 262 and 264). Each of these wires has a length of L3 (in one example, L3 is 2 microns). Fishbone structure 270 includes a superconducting backbone 272 and seven parallel hybrid wires (e.g., hybrid wires 282 and 284). Each of these wires has a length of L4 (in one example, L4 is 1.25 microns). Each of the superconducting backbones is made as narrow as possible in order to maximize the plunger gate voltage range where the hybrid wires are conducting, yet the superconducting backbone is still depleted.

Conductance values for the hybrid wires are obtained by performing measurements in a sequence for each of the hybrid wires associated with a specific fishbone structure. The junction gates for the wire under measurement can be set to a positive voltage to contact the semiconductor. The plunger gate for the hybrid wire is supplied a range of voltages during the measurement, while all of the other gates are set to negative voltages to deplete the semiconductor states. The nonlocal conductance value and the local conductance value for the respective hybrid wire is then measured with the superconducting backbone grounded. Having measured and obtained the nonlocal conductance ($-G_{RL}$) values and the local conductance values ($G_{RR}$ and $G_{LL}$), the localization lengths ($l_{loc}$) can be extracted by averaging the nonlocal conductance values over a small bias window. The localization length is then extracted by fitting the data to the expected value of the typical conductance ($(-G_{RL}/\sqrt{G_{RR}G_{LL}}) = A\exp(-2L/l_{loc})$), where $G_{RR}$ and $G_{LL}$ are the local conductance values, and it is assumed that the nonlocal conductance decays with the increase in length L.

Although FIG. 2 shows hybrid superconductor-semiconductor device 200 with four fishbone structures, it can include additional or fewer fishbone structures. In addition, although FIG. 2 shows each fishbone structure with seven hybrid wires of equal length, each fishbone structure can include additional or fewer such wires. Moreover, the lengths of the wires can be different for each fishbone structure from the examples provided herein. In addition, FIG. 2 shows a combination of four fishbone structures with seven wires per fishbone, which was selected to optimize the accuracy of the localization length estimates as the target with constraints, including the maximum number of gate lines on a die. This is because ideally one would like to have as many hybrid wires as possible on the chip including the hybrid superconductor-semiconductor device 200 because the more wires one has, the more accurately one can determine the localization length. However, the number of measurement lines that are available on a chip/die are limited. As an example, assuming there is a limit of 92 lines per die, then one is limited to having 92 connections to the hybrid wires. Thus, this constraint creates a limit as to the maximum number of hybrid wires one can have on a given die/chip. Other constraints include the number of connections available through the dilution refrigerators and other equipment required to operate and test hybrid superconductor-semiconductor devices.

Figure 3:
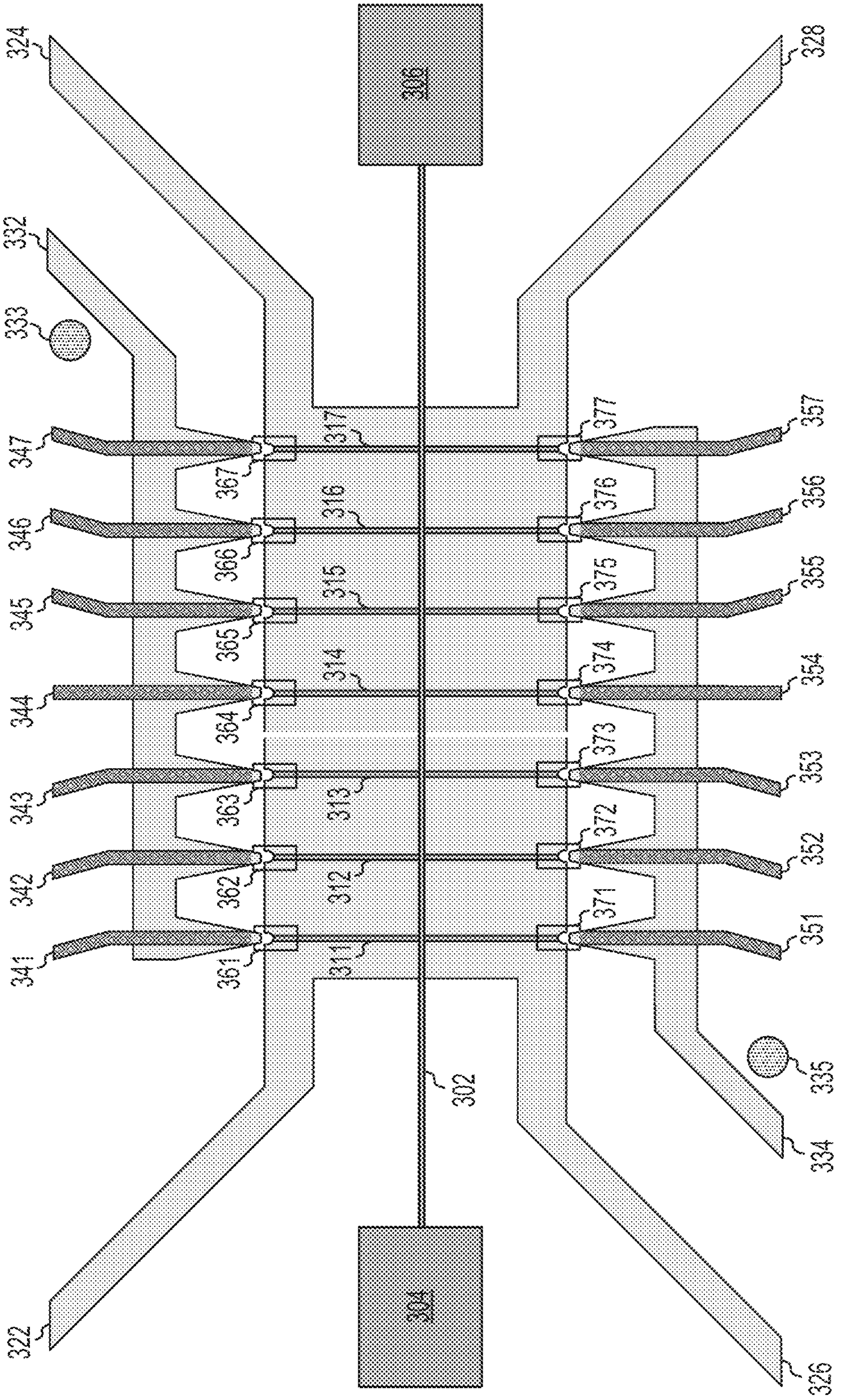
FIG. 3 is a diagram of an example fishbone structure and related gates included in a hybrid superconductor-semiconductor device in accordance with one example.

FIG. 3 is a diagram of an example fishbone structure 300 and related gates included in a hybrid superconductor-semiconductor device (e.g., hybrid superconductor-semiconductor device 200 of FIG. 2) in accordance with one example. Fishbone structure 300 can be used to implement any one of fishbone structure 210, fishbone structure 230, fishbone structure 250, or fishbone structure 270 of FIG. 2. Fishbone structure 300 includes a superconducting backbone 302 and seven parallel hybrid wires (e.g., hybrid wires 311, 312, 313, 314, 315, 316, and 317). Each of these wires has the same length. One end of superconducting backbone 302 has a terminal 304 and the other end of the superconducting backbone 302 has a terminal 306. These terminals can be used to supply a voltage to the superconducting backbone 302 or ground the superconducting backbone 302. The hybrid wires 311, 312, 313, 314, 315, 316, and 317 are formed in a 2DEG, whose electrochemical potential can be controlled using plunger gates 322, 324, 326, and 328. In addition, plunger gates 322 and 326 (shared by the hybrid wires 311, 312, and 313) can be used to selectively control the chemical potential in the hybrid wires 311, 312, and 313. Moreover, plunger gates 324 and 328 (shared by the hybrid wires 314, 315, 316, and 317) can be used to selectively control the chemical potential in the hybrid wires 314, 315, 316, and 317. Each of the plunger gates can be used to deplete the 2DEG. Once the 2DEG has been depleted, the plunger gates may be operated at even more negative voltages to tune the electrochemical potential, and therefore, the density underneath the wire. Plunger gates can also be used to allow for a regime in which a selected hybrid wire is not depleted but the superconducting backbone 302 is depleted. To implement this regime one can make the width of the superconducting backbone 302 slightly smaller than the width of each of hybrid wires 311, 312, 313, 314, 315, 316, and 317.

With continued reference to FIG. 3, helper gates 332 and 334 can be used to provide current flow through each of hybrid wires 311, 312, 313, 314, 315, 316, and 317. In this example, similar to the plunger gates, helper gates 332 and 334 are shared by hybrid wires 311, 312, 313, 314, 315, 316, and 317. Helper gates 332 and 334 may also be used to increase the electron density in the junctions and leads, the latter of which may be connected to measurement circuits. Helper gates 332 and 334 may also help define conducting paths by accumulating carrier density in the 2DEG underneath a specific hybrid wire and keeping such areas conductive. Each of the helper gates 332 and 334 has a metallic contact in its proximity (e.g., contact 333 and contact 335) that is connected directly to the 2DEG and functions as the source and/or drain of charge carriers (electrons). Application of a voltage to either contact 333 or contact 335 results in the application of a bias voltage across the hybrid wires. Alternatively, the connection of a current meter to either contact 333 or contact 335 allows one to measure the current through the hybrid wires.

Still referring to FIG. 3, fishbone structure 300 is further shown with cutter gates 341, 342, 343, 344, 345, 346, and 347 that are arranged to open and close end junctions 361, 362, 363, 364, 365, 366, and 367, respectively. In addition, cutter gates 351, 352, 353, 354, 355, 356, and 367 are arranged to open and close end junctions 371, 372, 373, 374, 375, 376, and 377, respectively. As part of the measurement of the conductance value for a respective wire the current through each of hybrid wires 311, 312, 313, 314, 315, 316, and 317 can be measured by tuning end junctions on both ends of the respective hybrid wire. As an example, during measurement of the current through hybrid wire 311, one can open end junction 361 using cutter gate 341 and open end junction 371 using cutter gate 351, while keeping all other end junctions closed. This allows for the measurement of the current through hybrid wire 311. During this measurement, the other hybrid wires are isolated from hybrid wire 311 under the conditions that the voltage applied to plunger gates 322, 326 is such that 2DEG underneath the superconducting backbone is depleted, and the measurement is performed at bias voltages smaller than the parent gap of the superconductor. In this manner, one can measure current through each of the hybrid wires 311, 312, 313, 314, 315, 316, and 317 one at a time. The measured current values underneath the helper gates 332 or 334, in response to the applied voltages together with an applied bias voltage to one of the contacts close to the helper gate 332 or helper gate 334, can be used to obtain the conductance values for each of the hybrid wires 311, 312, 313, 314, 315, 316, and 317. As an example, when measuring the current through wire 311, a bias may be applied to contact 335 next to helper gate 334. A measurement of the current through contact 335 near helper gate 334 then provides the local conductance, whereas a measurement of contact 333 near helper gate 332 provides the non-local conductance.

Figure 4:
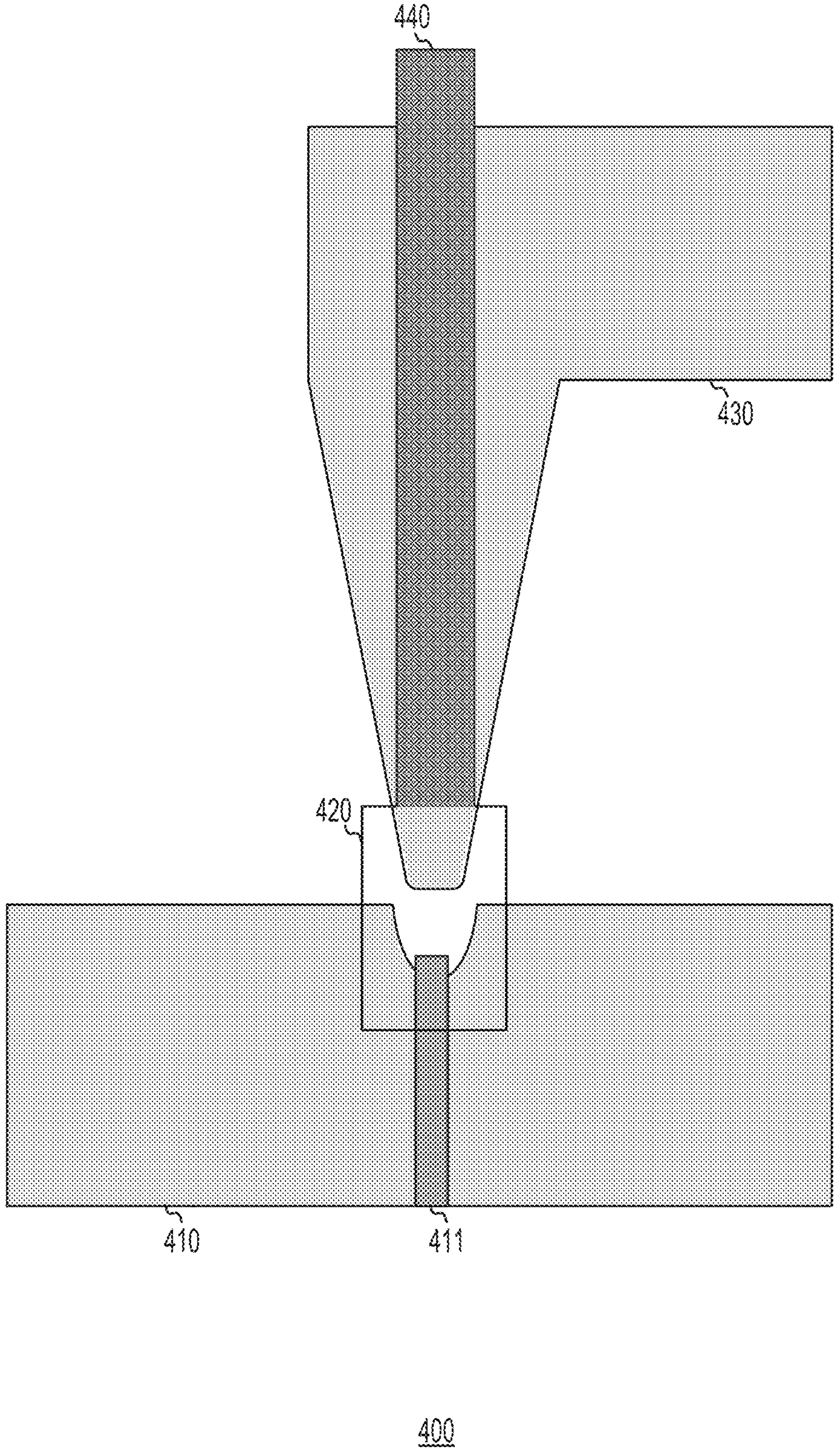
FIG. 4 is an expanded view of a section of the fishbone structure shown in FIG. 3.

FIG. 4 is an expanded view 400 of a section of the fishbone structure 300 of FIG. 3. Expanded view 400 shows an end junction 420 that is formed at one end of a hybrid wire 411 (e.g., hybrid wire 311). The hybrid wire 411 is formed within a 2DEG 410. Expanded view 400 further shows a portion of a helper gate 430 (e.g., a portion of helper gate 332 of FIG. 3). Expanded view 400 further shows a portion of cutter gate 440 (e.g., a portion of cutter gate 341 of FIG. 3).

Figure 5:
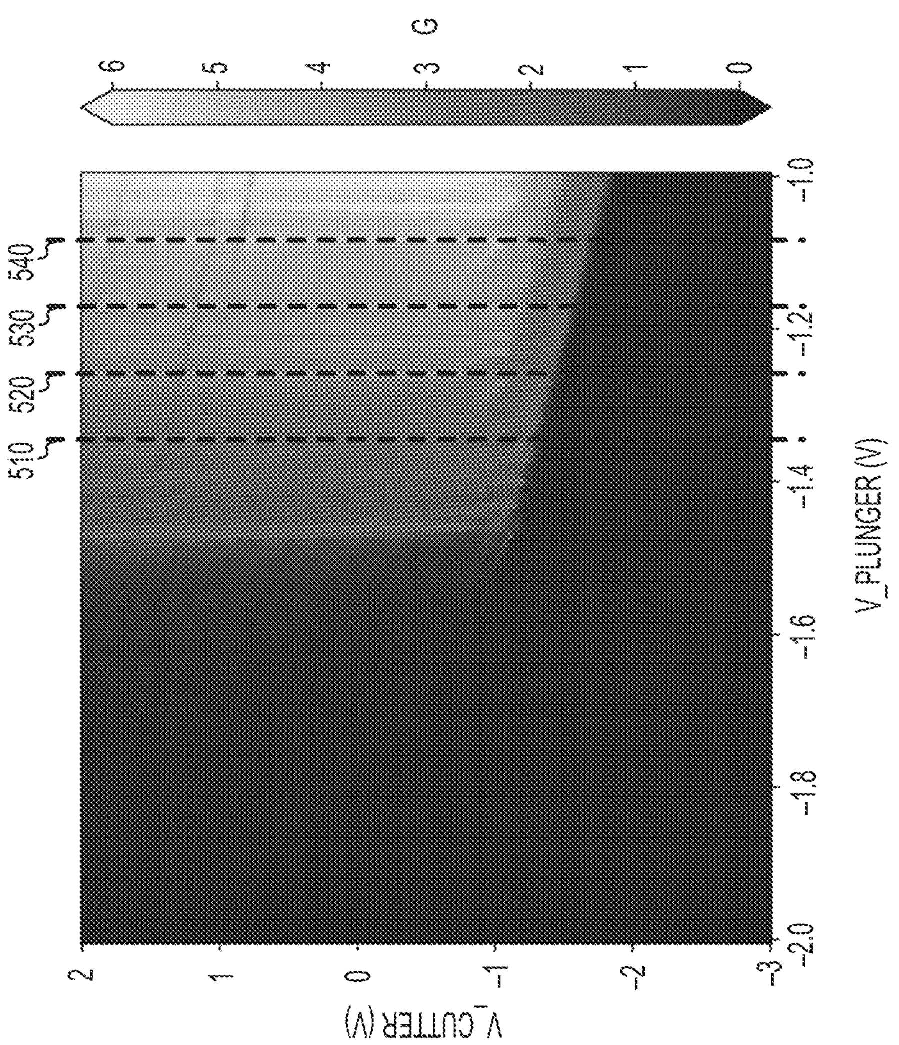
FIG. 5 shows a graph with sub-band transitions in the local conductance for a hybrid superconductor-semiconductor device including fishbone structures.

FIG. 5 shows a graph 500 with sub-band transitions in the local conductance for a hybrid superconductor-semiconductor device including the fishbone structures described earlier. The graph 500 includes a dotted line 510, which corresponds to the conductance appearing around certain voltage values, signifying the first sub-band. Dotted line 520 signifies the second sub-band transition. Dotted line 530 signifies the third sub-band transition. Dotted line 540 signifies the fourth sub-band transition. As one sweeps the plunger gate voltage (labeled as V_PLUNGER in FIG. 5) from negative to positive, one increases the electrochemical potential in the hybrid wire. As a result of the increase in the electrochemical potential, initially the hybrid wire will be depleted. Subsequently, with the increase in the electrochemical potential, the hybrid wire starts to occupy the first sub-band (e.g., the sub-band shown as dotted line 510). As one sweeps the plunger gate voltage further to the right additional sub-bands are occupied (e.g., the other sub-bands identified by dotted lines 520, 530, and 540).

Referring back to FIG. 3, as described earlier, fishbone structure 300 includes end junctions on each end of the hybrid wire (e.g., each of hybrid wires 311, 312, 313, 314, 315, 316, and 317). Advantageously, these end junctions allow one to use the local conductance values to extract the sub-band transitions more accurately. This is because the extraction of the sub-bands is not perfect for a single end junction because the local conductance will change depending on the local disorder realization in a particular hybrid wire. The local disorder realization can vary across the hybrid wires because of fabrication imperfections and other constraints. However, since each fishbone structure (e.g., fishbone structure 300) has 14 junctions, one has access to 14 local conductance values per fishbone structure. By averaging these local conductance values for the different fishbone structures, one can obtain access to the disorder-averaged sub-band positions, which are a better representation of the bulk sub-band transitions. The averaging of these local conductance values also helps reduce the sensitivity of the hybrid mobility protocol with respect to the variation in wire width among fishbones that may be introduced due to fabrication variability. As an example, the averaging of the local conductance values can also compensate for a larger spread between wire width among the different fishbone structures.

In addition, the replicated fishbone structures (e.g., the four fishbone structures shown in FIG. 2) and the corresponding hybrid wires also allow one to extract any variation in the depletion voltage (VDEP) for the nonlocal conductance measurements. This is because different levels of impurities in the hybrid wires depending on their location on the device can affect the electron mobility within the hybrid wire. If an impurity within a hybrid wire makes the electron transport harder then that would correspond to a more positive depletion voltage point. On the other hand, if an impurity within a hybrid wire makes the electron transport easier then that would correspond to a more negative depletion voltage point. By creating a histogram, or a similar measure, of the distribution of the depletion voltage values for the hybrid wires for each fishbone structure within the device, one can get a better understanding of the depletion voltage variation within the device. Since different types of disorder may give rise to different distributions, this methods gives one a better understanding of the type of disorder as well as its magnitude.

Figure 6:
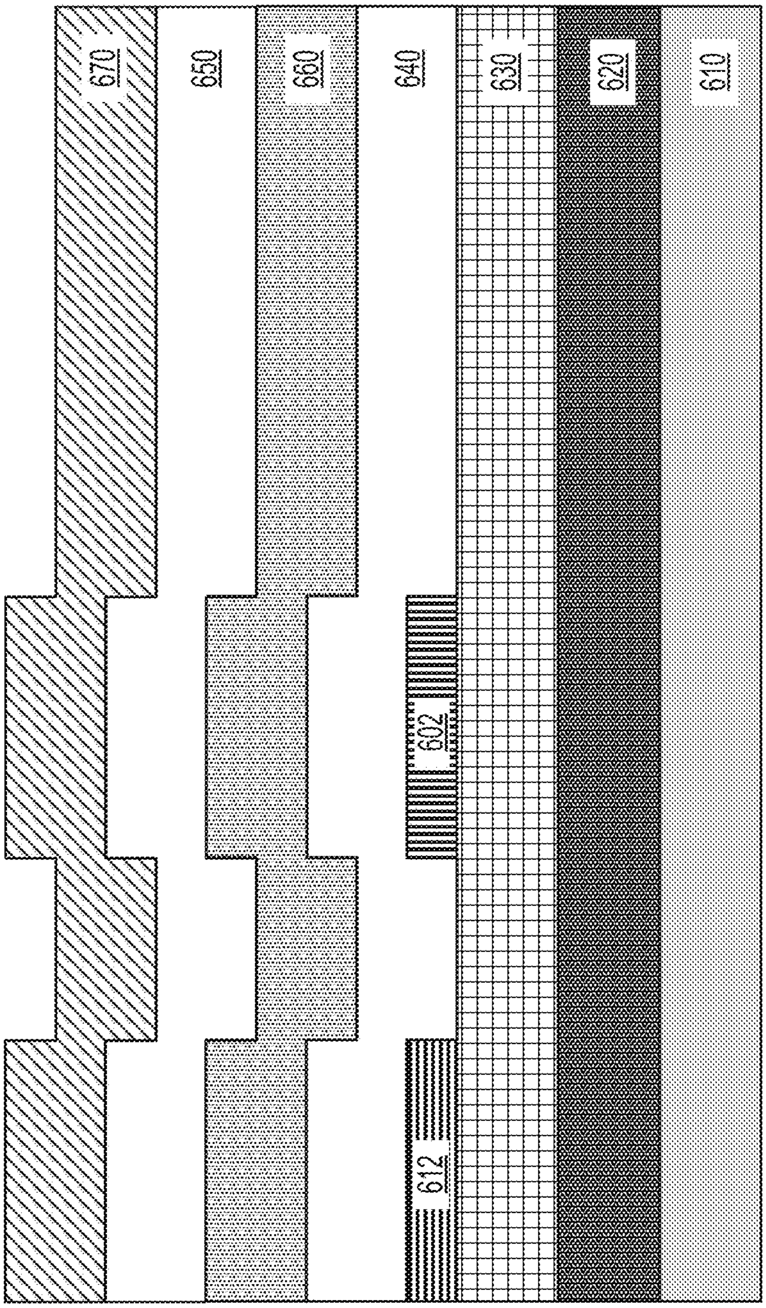
FIG. 6 is a cross-section view of a portion of the hybrid superconductor-semiconductor device of FIG. 2 in accordance with one example.

FIG. 6 is a cross-section view 600 of a portion of the hybrid superconductor-semiconductor device 200 of FIG. 2. The cross-section view is shown to illustrate the multi-layer structure, including various gates formed in different layers of the example hybrid superconductor-semiconductor device described herein. As shown in cross-section view 600, the hybrid superconductor-semiconductor device includes a substrate 610 and a quantum well 620, which is formed over substrate 610. The hybrid superconductor-semiconductor device further includes a barrier 630 formed over quantum well 620. In this example, substrate 1610 may be an indium phosphide (InP) substrate. Quantum well 620 may include several layers, including an indium arsenide (InAs) layer. Barrier 630 may have several layers, including indium gallium arsenide (InGaAs) layer and an indium aluminum arsenide (InAlAs) layer. Each of these layers may be formed using molecular-beam epitaxy (MBE). As an example, the MBE related process may be performed in an MBE system that allows the deposition of the appropriate materials in a vacuum.

With continued reference to FIG. 6, the cross-section view 600 shows a superconductor 602 (corresponding to a hybrid wire) and a contact 612. A dielectric layer 640 is shown as formed adjacent to and above superconductor 602. In one example, superconductor 602 may be formed by first forming an aluminum layer over barrier 630, and then forming a dielectric over the aluminum layer. Cross-section view 600 further shows a helper gate 660 formed over dielectric layer 640, a dielectric layer 650 formed over helper gate 660, and a cutter gate 670 formed over another dielectric layer 650. Dielectric layers 640 and 650 may be formed as oxide layers (e.g., hafnium oxide or aluminum oxide) or using another appropriate dielectric layer material. Helper gate 660 and cutter gate 670 may be formed of gold (Au) or a titanium-gold (Ti-Au) alloy. Although not shown in FIG. 6, plunger gates can be formed in the same layer as the helper gates. Although cross-section view 600 of FIG. 6 shows a certain number of layers and components arranged in a certain order, the device (e.g., hybrid superconductor-semiconductor device 200 of FIG. 2) may include additional or fewer layers, arranged differently.

Figure 7:
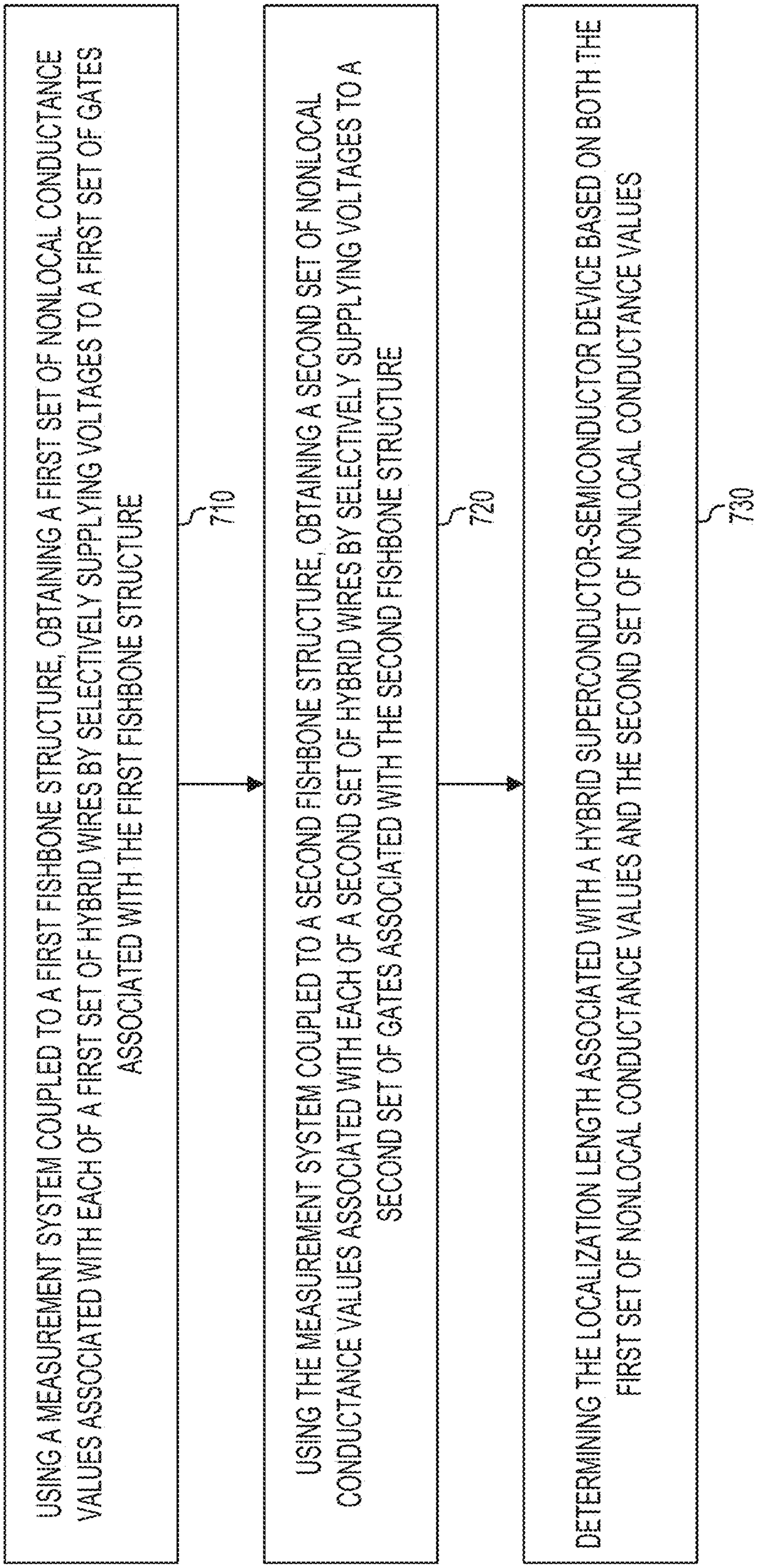
FIG. 7 is a flow chart of a method for determining localization lengths for the hybrid superconductor-semiconductor device of FIG. 2 in accordance with one example.

FIG. 7 is a flow chart 700 of a method for determining localization lengths for the hybrid superconductor-semiconductor device 200 of FIG. 2 in accordance with one example. The steps associated with this method may be performed using measurement system 202, including the fishbone structures, as described earlier with respect to FIGS. 2 and 3. The localization lengths may be estimated by executing instructions (e.g., the various code blocks) stored in memory 120 of computing system 100 of FIG. 1. Step 710 includes using a measurement system coupled to the first fishbone structure, obtaining a first set of nonlocal conductance values associated with each of a first set of hybrid wires by selectively supplying voltages to a first set of gates associated with a first fishbone structure. As explained earlier, in one example, the measurements associated with the conductance values correspond to a hybrid superconductor-semiconductor device (e.g., hybrid superconductor-semiconductor device 200 of FIG. 2). Measurement system 202 and its components, along with the fishbone structures, shown in FIG. 2 can be used to obtain the nonlocal conductance values and the local conductance values. The fishbone structure may correspond to fishbone structure 300 of FIG. 3. As an example, as explained earlier with respect to FIG. 3, as part of the measurement of the conductance values for a respective wire the current through each of hybrid wires 311, 312, 313, 314, 315, 316, and 317 can be measured by tuning end junctions on both ends of the respective hybrid wire. As an example, during measurement of the current through hybrid wire 311, one can open end junction 361 using cutter gate 341 and open end junction 371 using cutter gate 351, allowing for the measurement of the current through hybrid wire 311. During this measurement, the other hybrid wires are isolated from hybrid wire 311. In this manner, one can measure current through each of the hybrid wires 311, 312, 313, 314, 315, 316, and 317 one at a time. The measured current values, in response to the applied voltages, can be used to obtain the nonlocal conductance values for each of the hybrid wires 311, 312, 313, 314, 315, 316, and 317. Measurement and interface code 122 of FIG. 1 may also be used in conjunction with measurement system 202 of FIG. 2 to allow a user to control the various knobs (e.g., plunger voltage or other voltages) associated with the measurement of the nonlocal conductance values and the measurement of local conductance values.

Step 720 includes using the measurement system coupled to the second fishbone structure, obtaining a second set of nonlocal conductance values associated with each of the second set of hybrid wires by selectively supplying voltages to a second set of gates associated with the second fishbone structure. As explained earlier, in one example, the measurements associated with the conductance values correspond to a hybrid superconductor-semiconductor device (e.g., hybrid superconductor-semiconductor device 200 of FIG. 2). Measurement system 202 and its components, along with the fishbone structures, shown in FIG. 2 can be used to obtain the nonlocal conductance values and the local conductance values. The fishbone structure may correspond to fishbone structure 300 of FIG. 3. As an example, as explained earlier with respect to FIG. 3, as part of the measurement of the conductance values for a respective wire the current through each of hybrid wires 311, 312, 313, 314, 315, 316, and 317 can be measured by tuning end junctions on both ends of the respective hybrid wire. As an example, during measurement of the current through hybrid wire 311, one can open end junction 361 using cutter gate 341 and open end junction 371 using cutter gate 351, allowing for the measurement of the current through hybrid wire 311. During this measurement, the other hybrid wires are isolated from hybrid wire 311. In this manner, one can measure current through each of the hybrid wires 311, 312, 313, 314, 315, 316, and 317 one at a time. The measured current values, in response to the applied voltages, can be used to obtain the nonlocal conductance values for each of the hybrid wires 311, 312, 313, 314, 315, 316, and 317. Measurement and interface code 122 of FIG. 1 may also be used in conjunction with measurement system 202 of FIG. 2 to allow a user to control the various knobs (e.g., plunger voltage or other voltages) associated with the measurement of the nonlocal conductance values and the measurement of local conductance values.

Step 730 includes determining the localization length associated with the hybrid superconductor-semiconductor device based on both the first set of nonlocal conductance values and the second set of nonlocal conductance values. As explained earlier, having obtained the conductance values (both local conductance values and the nonlocal conductance values), measurement system 202 can provide these values via interface 201 to the computing system 100 of FIG. 1. Instructions, when executed by a processor, can be used to determine the localization length. LL estimation code 126 may include instructions with respect to this method step. As an example, LL estimation code 126 may include software libraries and other code for processing the measurement data, extracting localization lengths, and estimating the localization lengths. As explained earlier, various statistical techniques can be used to determine the localization lengths.

Figure 8:
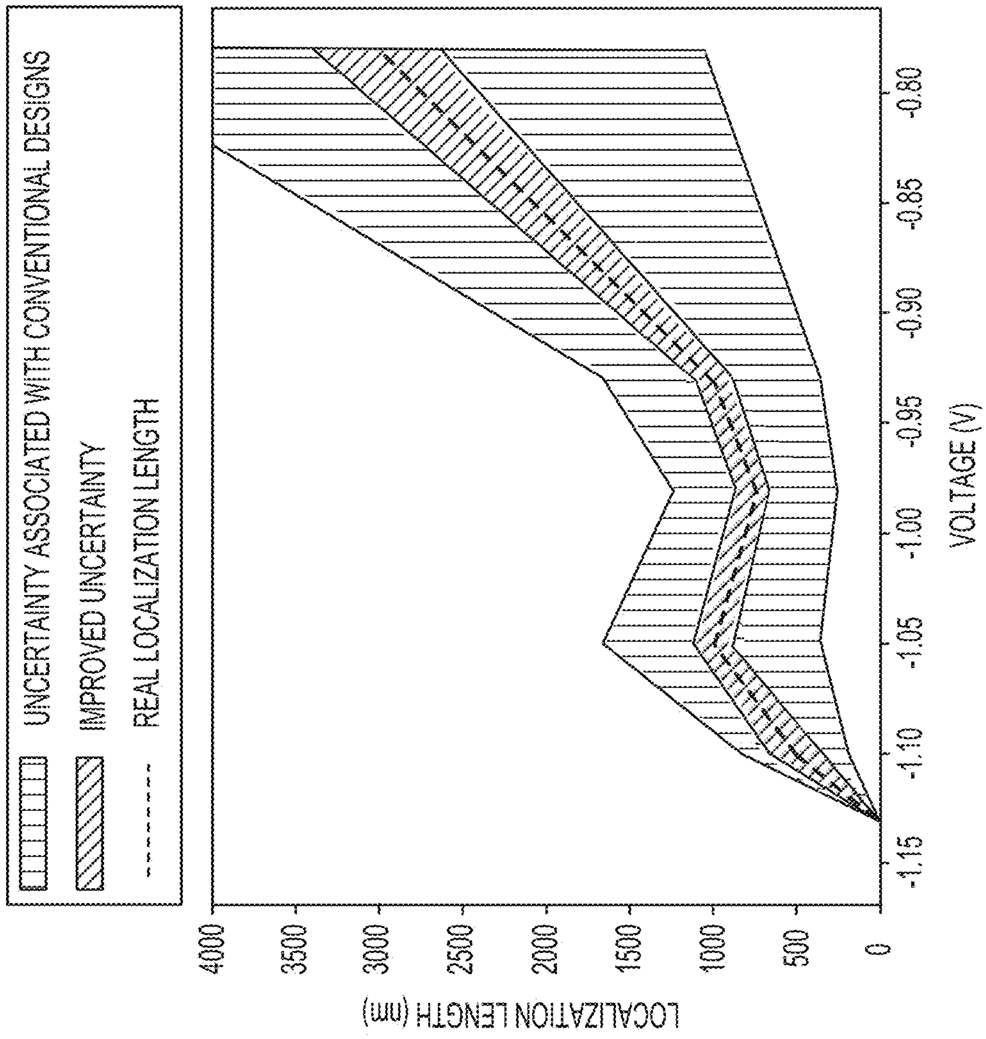
FIG. 8 is a graph illustrating an improvement in the degree of uncertainty in determining the localization lengths associated with a hybrid superconductor-semiconductor device.

FIG. 8 is a graph 800 illustrating an improvement in the degree of uncertainty in determining the localization lengths associated with a hybrid superconductor-semiconductor device. As noted earlier, current designs for performing localization length determination contain a small number of wires, which results in a large uncertainty in the estimate of the localization length. The dotted line in graph 800 shows an ideal measure of the localization length. The area shaded with vertical lines shows the high degree of uncertainty associated with conventional designs in determining the localization length in relation to the plunger voltage. The area shaded with slanted lines shows a lower degree of uncertainty associated with the fishbone design in determining the localization length in relation to the plunger voltage.

Figure 9:
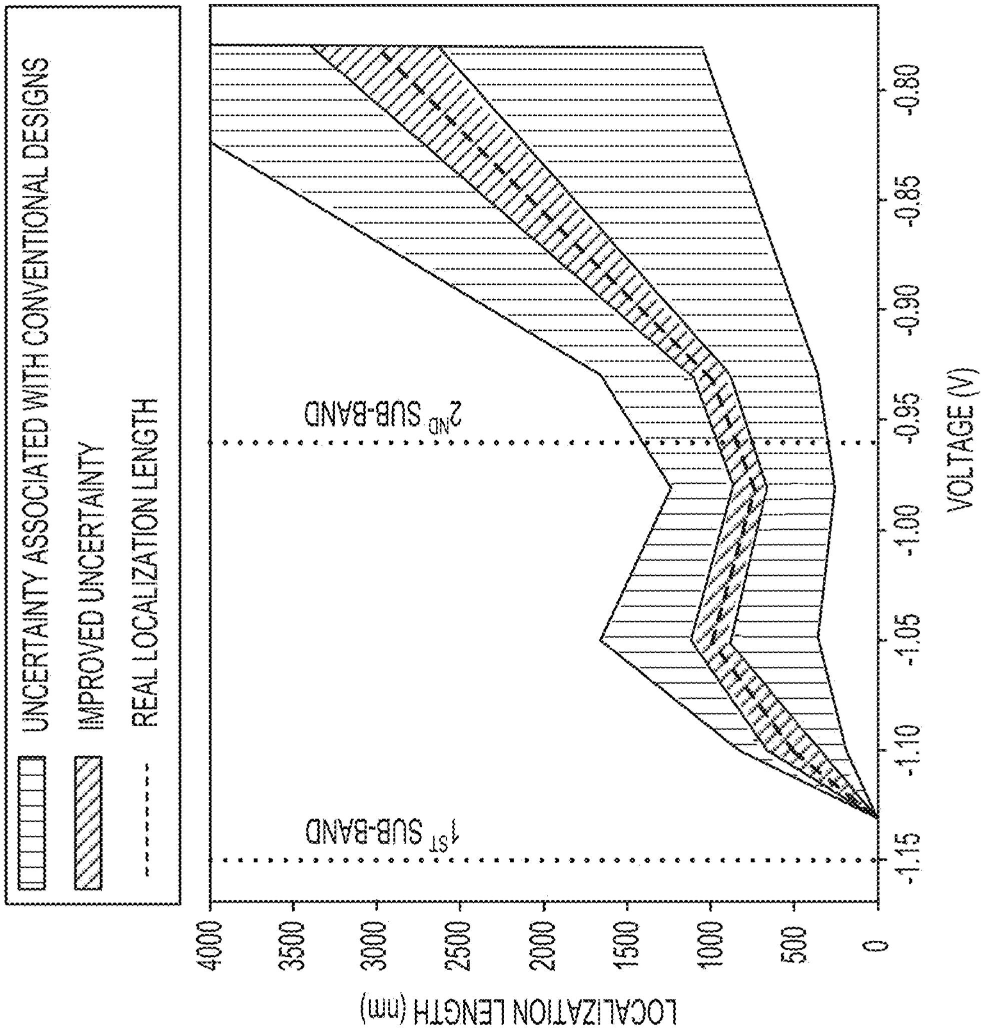
FIG. 9 is another graph illustrating an improvement in the degree of uncertainty in determining the localization lengths associated with a hybrid superconductor-semiconductor device.

Similar to graph 800 of FIG. 8, FIG. 9 is a graph 900 illustrating an improvement in the degree of uncertainty in determining the localization lengths associated with a hybrid superconductor-semiconductor device. Graph 900 further shows better identification of the first sub-band and the second sub-band. As noted earlier, the fishbone structure includes multiple end junctions, which allow one to use the local conductance values to extract the sub-band transitions more accurately. This is because the extraction of sub-bands is not perfect for a single end junction because the local conductance will change depending on the local disorder realization in a particular hybrid wire. The local disorder realization can vary across the hybrid wires because of fabrication imperfections and other constraints. However, since each fishbone structure (e.g., fishbone structure 300 of FIG. 3) has 14 junctions, one has access to 14 local conductance values per fishbone structure. By averaging these local conductance values for the different fishbone structures, one can obtain access to the disorder-averaged sub-band positions, which are a better representation of the bulk sub-band transitions.

Figure 10:
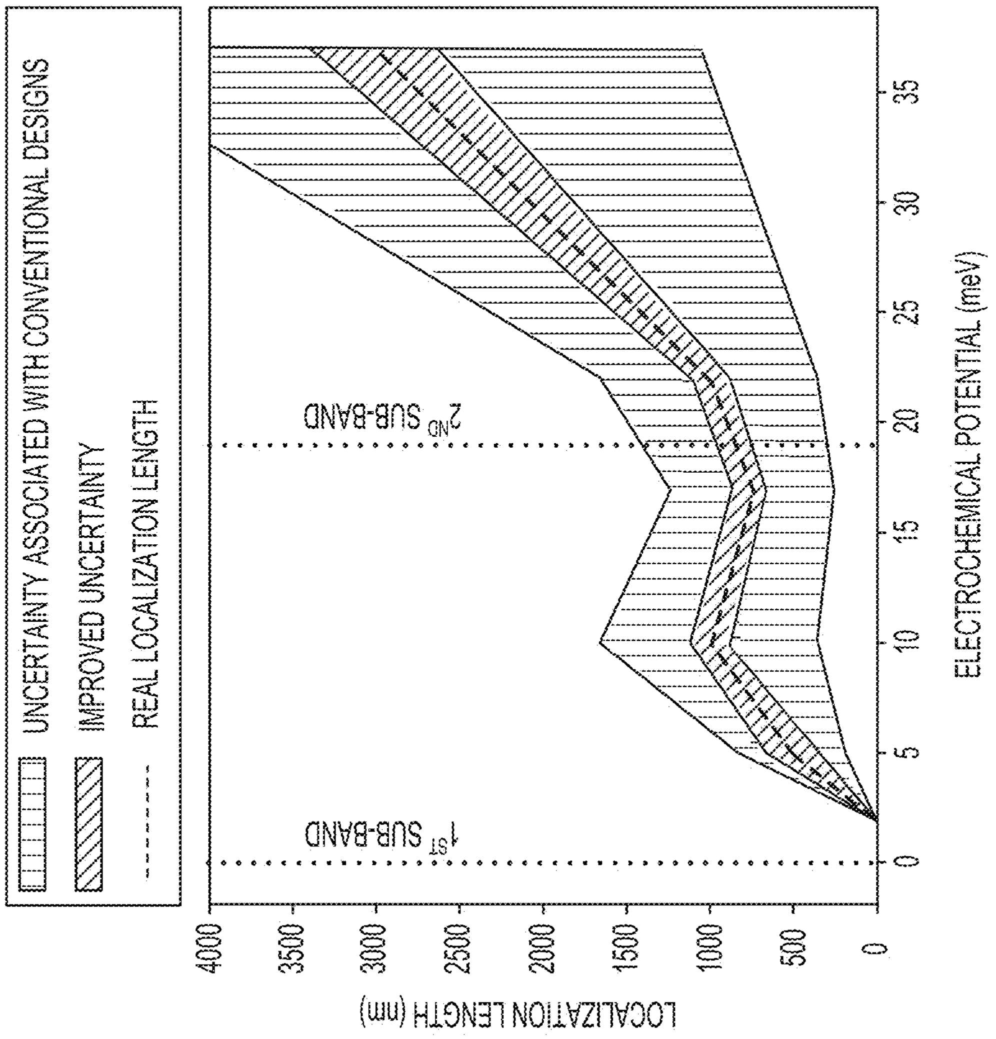
FIG. 10 is yet another graph illustrating an improvement in the degree of uncertainty in determining the localization lengths associated with a hybrid superconductor-semiconductor device.

FIG. 10 is another graph 1000 illustrating an improvement in the degree of uncertainty in determining the localization lengths associated with a hybrid superconductor-semiconductor device. As noted earlier, current designs for performing localization length determination contain a small number of wires, which results in a large uncertainty in the estimate of the localization length. The dotted line in graph 1000 shows an ideal measure of the localization length. The area shaded with vertical lines shows the high degree of uncertainty associated with conventional designs in determining the localization length in relation to the electrochemical potential in the hybrid wire. The area shaded with slanted lines shows a lower degree of uncertainty associated with the fishbone design in determining the localization length in relation to the electrochemical potential in the hybrid wire.

With continued reference to graph 1000 of FIG. 10, the hybrid mobility protocol with the fishbone structures allows one to not only measure the nonlocal conductance values, but also measure the local conductance values, allowing one to discern the sub-band positions. Measuring only the nonlocal conductance values, as with conventional designs, one would determine the localization length as a function of the plunger gate voltage only. However, using the current design, the measurement of the local conductance values informs one of the sub-band positions. When this information is used together with lever arm information stemming from either a numerical model of the system or from additional lever-arm measurements performed on the device described herein, it allows for a translation from the plunger voltage (shown along the horizontal axis in graph 900 of FIG. 9) to density (shown as the electrochemical potential in graph 1000) in the system. This provides an additional advantage in terms of the modeling of various hybrid superconductor-semiconductor devices because the models can be used to calculate density, but not the absolute plunger voltages. Accordingly, by having this transformation one can compare theoretical models of the various hybrid superconductor-semiconductor devices relatively easily.

Figure 11:
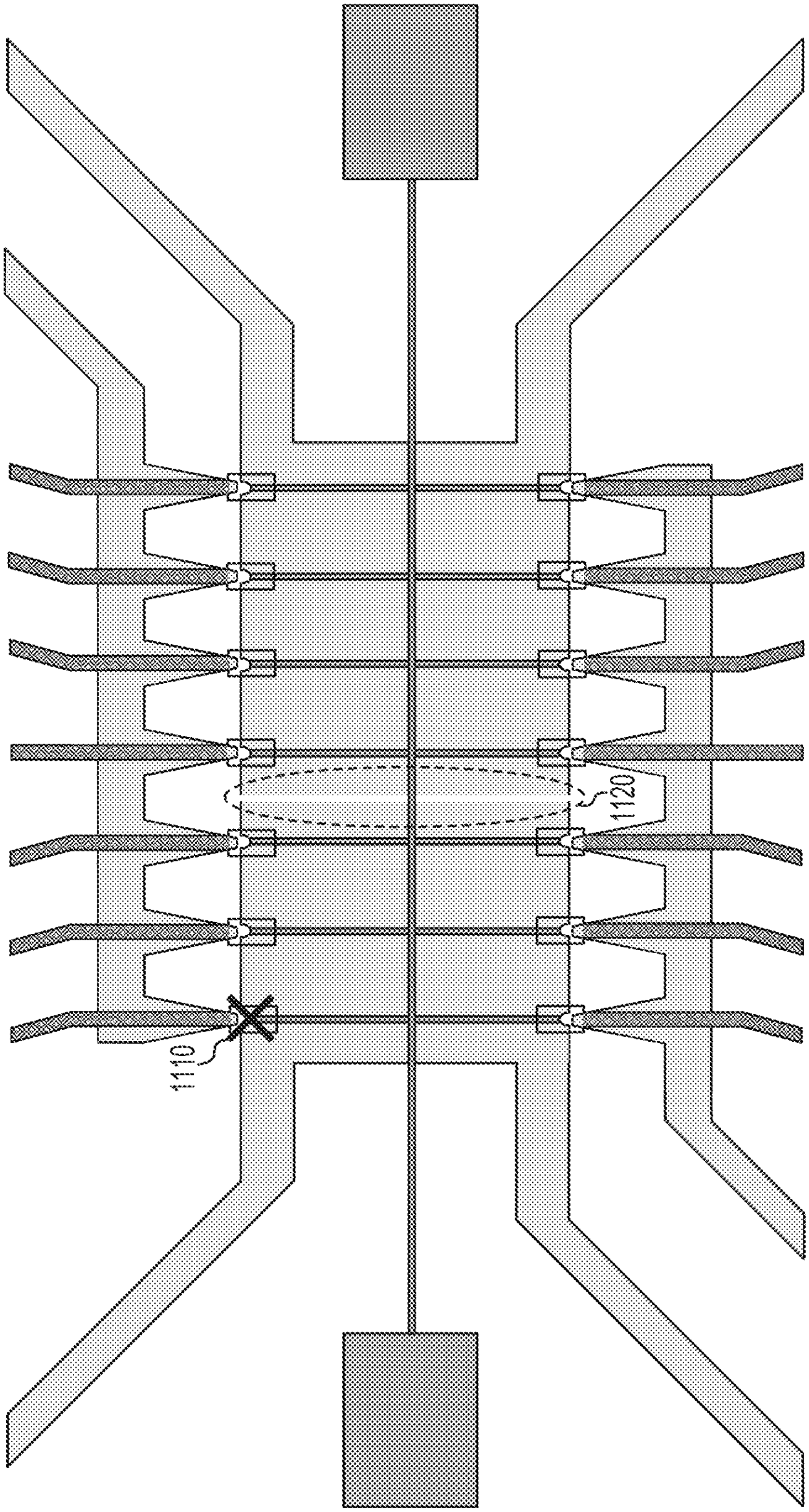
FIG. 11 illustrates the robustness of the fishbone design within a hybrid superconductor-semiconductor device with respect to certain types of fabrication failures.

FIG. 11 illustrates the robustness of the fishbone design within a hybrid superconductor-semiconductor device (similar to hybrid superconductor-semiconductor device 200 of FIG. 2 with fishbone structure 300 of FIG. 3) with respect to certain types of fabrication failures. Fishbone structure 1100 (similar to fishbone structure 300 of FIG. 3) is designed to be fault-tolerant with respect to certain types of fabrication failures. As an example, FIG. 11 shows a failure 1110 with respect to a cutter gate in fishbone structure 1100. Example failures include a non-responsive gate, a leaking gate, or a gate that does not close even when a certain amount of voltage (e.g., referred to as the pinch-off voltage) is applied to the gate. Additional failures relate to any shorts or opens, or similar such failures, in any of the gate lines. As an example, in a hybrid superconductor-semiconductor device with four fishbone structures, there may be as many as 22 gate lines per fishbone, resulting in a total number of 88 lines for the fishbone structures. Since each gate and each gate line has a certain finite amount of failure probability during the fabrication, or later, the likelihood that the entire fishbone structure fails is higher with such a high number of gates and gate lines per fishbone structure.

With continued reference to FIG. 11, fishbone structure 1100 includes a gap 1120, which creates a split plunger gate. This allows the portion of the device that is to the right of the gap 1120 to operate with the help of the plunger gates and other gates on the right side of the device. Thus, while the hybrid wires on the left side of the fishbone structure are not usable because of the failure 1110, the hybrid wires on the right side of the fishbone structure can still be used as part of the local conductance and nonlocal conductance measurements described earlier. Indeed, failures in other locations in the fishbone structure 1000 can similarly be managed as long as they occur only on one side of the gap 1120.

In conclusion, the present disclosure relates to a hybrid superconductor-semiconductor device comprising a first fishbone structure comprising a first superconducting backbone arranged in a first direction and a first set of hybrid wires arranged in a second direction, perpendicular to the first direction, where each of the first set of hybrid wires has a same first length in the second direction. The hybrid superconductor-semiconductor device further includes a second fishbone structure comprising a second superconducting backbone arranged in the first direction and a second set of hybrid wires arranged in the second direction, where each of the second set of hybrid wires has a same second length, different from the first length, in the second direction.

The hybrid superconductor-semiconductor device further includes a measurement system to: (1) obtain a first set of nonlocal conductance values associated with each of the first set of hybrid wires by selectively supplying voltages to a first set of gates associated with the first fishbone structure, and (2) obtain a second set of nonlocal conductance values associated with each of the second set of hybrid wires by selectively supplying voltages to a second set of gates associated with the second fishbone structure.

Each of the first set of hybrid wires may comprise a first set of end junctions. The measurement system may be configured to obtain a first set of local conductance values using the first set of end junctions. Each of the second set of hybrid wires may comprise a second set of end junctions. The measurement system may further be configured to obtain a second set of local conductance values using the second set of end junctions. The measurement system may further be configured to: (1) allow determination of, by averaging the first set of measured local conductance values, a first set of disorder-averaged sub-band transitions in a plunger voltage associated with the first set of hybrid wires, and (2) allow determination of, by averaging the second set of measured local conductance values, a second set of disorder-averaged sub-band transitions in a electrochemical potential associated with the second set of hybrid wires.

The measurement system may further be configured to: (1) independently determine an electrochemical potential associated with each of the first set of hybrid wires, and (2) independently determine an electrochemical potential associated with each of the second set of hybrid wires. The first set of gates may comprise a first set of plunger gates and a first set of helper gates. The first set of plunger gates may share a first connection to the measurement system and the first set of helper gates may share a second connection to the measurement system. The second set of gates may comprise a second set of plunger gates and a second set of helper gates. The second set of plunger gates may share a third connection to the measurement system. The second set of helper gates may share a fourth connection to the measurement system.

The measurement system may further be configured to extract an indicator of any variation in depletion voltages that are applied during measurement of the first set of nonlocal conductance values associated with the first set of hybrid wires and during measurement of the second set of nonlocal conductance values associated with the second set of hybrid wires. The hybrid superconductor-semiconductor may further comprise a first gap for splitting plunger gates associated with the first fishbone structure and a second gap for splitting plunger gates associated with the second fishbone structure in order to make the hybrid superconductor-semiconductor device more robust against fabrication failures.

In another example, the present disclosure relates to a method for determining a localization length of a hybrid superconductor-semiconductor device. The hybrid superconductor-semiconductor device comprises: (1) a first fishbone structure comprising a first superconducting backbone arranged in a first direction and a first set of hybrid wires arranged in a second direction, perpendicular to the first direction, where each of the first set of hybrid wires has a same first length in the second direction, and (2) a second fishbone structure comprising a second superconducting backbone arranged in the first direction and a second set of hybrid wires arranged in the second direction, where each of the second set of hybrid wires has a same second length, different from the first length, in the second direction.

The method includes using a measurement system coupled to the first fishbone structure, obtaining a first set of nonlocal conductance values associated with each of the first set of hybrid wires by selectively supplying voltages to a first set of gates associated with the first fishbone structure. The method further includes using the measurement system coupled to the second fishbone structure, obtaining a second set of nonlocal conductance values associated with each of the second set of hybrid wires by selectively supplying voltages to a second set of gates associated with the second fishbone structure. The method further includes determining the localization length associated with the hybrid superconductor-semiconductor device based on both the first set of nonlocal conductance values and the second set of nonlocal conductance values.

Each of the first set of hybrid wires may comprise a first set of end junctions and each of the second set of hybrid wires may comprise a second set of end junctions. The method may further include, using the measurement system, obtaining a first set of local conductance values via the first set of end junctions and a second set of local conductance values via the second set of end junctions, and determining the localization length associated with the hybrid superconductor-semiconductor device based on both measured nonlocal conductance values and measured local conductance values.

The method may further include: (1) averaging the first set of measured local conductance values to determine a first set of disorder-averaged sub-band transitions in a plunger voltage associated with the first set of hybrid wires, and (2) averaging the second set of measured local conductance values to determine a second set of disorder-averaged sub-band transitions in a plunger voltage associated with the second set of hybrid wires. The may further include: (1) independently determining an electrochemical potential associated with each of the first set of hybrid wires, and (2) independently determining electrochemical potential associated with each of the second set of hybrid wires.

The first set of gates may comprise a first set of plunger gates and a first set of helper gates. The first set of plunger gates may share a first connection to the measurement system and the first set of helper gates may share a second connection to the measurement system. The second set of gates may comprise a second set of plunger gates and a second set of helper gates. The second set of plunger gates may share a third connection to the measurement system. The second set of helper gates may share a fourth connection to the measurement system. The method may further include extracting an indicator of any variation in depletion voltages that are applied during measurement of the first set of nonlocal conductance values associated with the first set of hybrid wires and during measurement of the second set of nonlocal conductance values associated with the second set of hybrid wires.

In yet another example, the present disclosure relates to a hybrid superconductor-semiconductor device comprising a first fishbone structure comprising a first superconducting backbone arranged in a first direction and a first set of hybrid wires arranged in a second direction, perpendicular to the first direction, where each of the first set of hybrid wires has a same first length in the second direction. The hybrid superconductor-semiconductor device further includes a second fishbone structure comprising a second superconducting backbone arranged in the first direction and a second set of hybrid wires arranged in the second direction, where each of the second set of hybrid wires has a same second length, different from the first length, in the second direction.

The hybrid superconductor-semiconductor device further includes a third fishbone structure comprising a third superconducting backbone arranged in the first direction and a third set of hybrid wires arranged in the second direction, where each of the third set of hybrid wires has a same third length, different from each of the first length and the second length, in the second direction. The hybrid superconductor-semiconductor device further includes a fourth fishbone structure comprising a fourth superconducting backbone arranged in the first direction and a fourth set of hybrid wires arranged in the second direction, where each of the fourth set of hybrid wires has a same fourth length, different from each of the first length, the second length, and the third length, in the second direction.

The hybrid superconductor-semiconductor device further includes a measurement system to: (1) obtain a first set of nonlocal conductance values associated with each of the first set of hybrid wires associated with the first fishbone structure, (2) obtain a second set of nonlocal conductance values associated with each of the second set of hybrid wires associated with the second fishbone structure, (3) obtain a third set of nonlocal conductance values associated with each of the third set of hybrid wires associated with the third fishbone structure, and (4) obtain a fourth set of nonlocal conductance values associated with each of the fourth set of hybrid wires associated with the fourth fishbone structure.

Each of the first set of hybrid wires, the second set of hybrid wires, the third set of hybrid wires, and the fourth set of hybrid wires may comprise end junctions. The measurement system may further be configured to obtain a set of local conductance values using the end junctions. The measurement system may further be configured to allow determination of, by averaging the measured local conductance values, a set of disorder-averaged sub-band transitions in a plunger voltage associated with the hybrid superconductor-semiconductor device.

The measurement system may further be configured to: (1) independently determine an electrochemical potential associated with each of the first set of hybrid wires, (2) independently determine an electrochemical potential associated with each of the second set of hybrid wires, (3) independently determine an electrochemical potential associated with each of the third set of hybrid wires, and (4) independently determine an electrochemical potential associated with each of the fourth set of hybrid wires.

Aa part of the hybrid superconductor-semiconductor device, a first set of plunger gates associated with the first fishbone structure may share a first connection to the measurement system and a first set of helper gates associated with the first fishbone structure may share a second connection to the measurement system. Moreover, a second set of plunger gates associated with the second fishbone structure may share a third connection to the measurement system and a second set of helper gates associated with the second fishbone structure may share a fourth connection to the measurement system. In addition, a third set of plunger gates associated with the third fishbone structure may share a fifth connection to the measurement system and a third set of helper gates associated with the third fishbone structure may share a sixth connection to the measurement system. Furthermore, a fourth set of plunger gates associated with the fourth fishbone structure may share a seventh connection to the measurement system and a fourth set of helper gates associated with the fourth fishbone structure may share an eighth connection to the measurement system.

The measurement system may further be configured to extract an indicator of any variation in depletion voltages that are applied during measurement of the first set of nonlocal conductance values associated with the first set of hybrid wires, during measurement of the second set of nonlocal conductance values associated with the second set of hybrid wires, during measurement of the third set of nonlocal conductance values associated with the third set of hybrid wires, and during measurement of the fourth set of nonlocal conductance values associated with the fourth set of hybrid wires. The hybrid superconductor-semiconductor device may further comprise a first gap for splitting plunger gates associated with the first fishbone structure, a second gap for splitting plunger gates associated with the second fishbone structure, a third gap for splitting plunger gates associated with the third fishbone structure, and a fourth gap for splitting plunger gates associated with the fourth fishbone structure in order to make the hybrid superconductor-semiconductor device more robust against fabrication failures.

It is to be understood that the systems, devices, methods, and components described herein are merely examples. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality. Merely because a component, which may be an apparatus, a structure, a device, a system, or any other implementation of a functionality, is described herein as being coupled to another component does not mean that the components are necessarily separate components. As an example, a component A described as being coupled to another component B may be a sub-component of the component B, the component B may be a sub-component of the component A, or components A and B may be a combined sub-component of another component C.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A hybrid superconductor-semiconductor device comprising:

a first fishbone structure comprising a first superconducting backbone arranged in a first direction and a first set of hybrid wires arranged in a second direction, perpendicular to the first direction, wherein each of the first set of hybrid wires has a same first length in the second direction;

a second fishbone structure comprising a second superconducting backbone arranged in the first direction and a second set of hybrid wires arranged in the second direction, wherein each of the second set of hybrid wires has a same second length, different from the first length, in the second direction; and a measurement system to: (1) obtain a first set of nonlocal conductance values associated with each of the first set of hybrid wires by selectively supplying voltages to a first set of gates associated with the first fishbone structure, and (2) obtain a second set of nonlocal conductance values associated with each of the second set of hybrid wires by selectively supplying voltages to a second set of gates associated with the second fishbone structure.

2. The hybrid superconductor-semiconductor device of claim 1, wherein each of the first set of hybrid wires comprises a first set of end junctions, and wherein the measurement system is configured to obtain a first set of local conductance values using the first set of end junctions, and wherein each of the second set of hybrid wires comprises a second set of end junctions, and wherein the measurement system is further configured to obtain a second set of local conductance values using the second set of end junctions.

3. The hybrid superconductor-semiconductor device of claim 2, wherein the measurement system is further configured to: (1) allow determination of, by averaging the first set of measured local conductance values, a first set of disorder-averaged sub-band transitions in a plunger voltage associated with the first set of hybrid wires, and (2) allow determination of, by averaging the second set of measured local conductance values, a second set of disorder-averaged sub-band transitions in a electrochemical potential associated with the second set of hybrid wires.

4. The hybrid superconductor-semiconductor device of claim 1, wherein the measurement system is further configured to: (1) independently determine an electrochemical potential associated with each of the first set of hybrid wires, and (2) independently determine an electrochemical potential associated with each of the second set of hybrid wires.

5. The hybrid superconductor-semiconductor device of claim 1, wherein the first set of gates comprises a first set of plunger gates and a first set of helper gates, wherein the first set of plunger gates share a first connection to the measurement system, and wherein the first set of helper gates share a second connection to the measurement system, and wherein the second set of gates comprises a second set of plunger gates and a second set of helper gates, wherein the second set of plunger gates share a third connection to the measurement system, and wherein the second set of helper gates share a fourth connection to the measurement system.

6. The hybrid superconductor-semiconductor device of claim 1, wherein the measurement system is further configured to extract an indicator of any variation in depletion voltages that are applied during measurement of the first set of nonlocal conductance values associated with the first set of hybrid wires and during measurement of the second set of nonlocal conductance values associated with the second set of hybrid wires.

7. The hybrid superconductor-semiconductor device of claim 1, further comprising a first gap for splitting plunger gates associated with the first fishbone structure and a second gap for splitting plunger gates associated with the second fishbone structure in order to make the hybrid superconductor-semiconductor device more robust against fabrication failures.

8. A method for determining a localization length of a hybrid superconductor-semiconductor device, wherein the hybrid superconductor-semiconductor device comprises: (1) a first fishbone structure comprising a first superconducting backbone arranged in a first direction and a first set of hybrid wires arranged in a second direction, perpendicular to the first direction, wherein each of the first set of hybrid wires has a same first length in the second direction, and (2) a second fishbone structure comprising a second superconducting backbone arranged in the first direction and a second set of hybrid wires arranged in the second direction, wherein each of the second set of hybrid wires has a same second length, different from the first length, in the second direction, the method comprising:

using a measurement system coupled to the first fishbone structure, obtaining a first set of nonlocal conductance values associated with each of the first set of hybrid wires by selectively supplying voltages to a first set of gates associated with the first fishbone structure;

using the measurement system coupled to the second fishbone structure, obtaining a second set of nonlocal conductance values associated with each of the second set of hybrid wires by selectively supplying voltages to a second set of gates associated with the second fishbone structure; and determining the localization length associated with the hybrid superconductor-semiconductor device based on both the first set of nonlocal conductance values and the second set of nonlocal conductance values.

9. The method of claim 8, wherein each of the first set of hybrid wires comprises a first set of end junctions and each of the second set of hybrid wires comprises a second set of end junctions, and wherein the method further comprises: using the measurement system, obtaining a first set of local conductance values via the first set of end junctions and a second set of local conductance values via the second set of end junctions, and determining the localization length associated with the hybrid superconductor-semiconductor device based on both measured nonlocal conductance values and measured local conductance values.

10. The method of claim 9, further comprising: (1) averaging the first set of measured local conductance values to determine a first set of disorder-averaged sub-band transitions in a plunger voltage associated with the first set of hybrid wires, and (2) averaging the second set of measured local conductance values to determine a second set of disorder-averaged sub-band transitions in a plunger voltage associated with the second set of hybrid wires.

11. The method of claim 8, further comprising: (1) independently determining an electrochemical potential associated with each of the first set of hybrid wires, and (2) independently determining electrochemical potential associated with each of the second set of hybrid wires.

12. The method of claim 8, wherein the first set of gates comprises a first set of plunger gates and a first set of helper gates, wherein the first set of plunger gates share a first connection to the measurement system, and wherein the first set of helper gates share a second connection to the measurement system, and wherein the second set of gates comprises a second set of plunger gates and a second set of helper gates, wherein the second set of plunger gates share a third connection to the measurement system, and wherein the second set of helper gates share a fourth connection to the measurement system.

13. The method of claim 8, further comprising extracting an indicator of any variation in depletion voltages that are applied during measurement of the first set of nonlocal conductance values associated with the first set of hybrid wires and during measurement of the second set of nonlocal conductance values associated with the second set of hybrid wires.

14. A hybrid superconductor-semiconductor device comprising:

a first fishbone structure comprising a first superconducting backbone arranged in a first direction and a first set of hybrid wires arranged in a second direction, perpendicular to the first direction, wherein each of the first set of hybrid wires has a same first length in the second direction;

a second fishbone structure comprising a second superconducting backbone arranged in the first direction and a second set of hybrid wires arranged in the second direction, wherein each of the second set of hybrid wires has a same second length, different from the first length, in the second direction;

a third fishbone structure comprising a third superconducting backbone arranged in the first direction and a third set of hybrid wires arranged in the second direction, wherein each of the third set of hybrid wires has a same third length, different from each of the first length and the second length, in the second direction;

a fourth fishbone structure comprising a fourth superconducting backbone arranged in the first direction and a fourth set of hybrid wires arranged in the second direction, wherein each of the fourth set of hybrid wires has a same fourth length, different from each of the first length, the second length, and the third length, in the second direction; and a measurement system to: (1) obtain a first set of nonlocal conductance values associated with each of the first set of hybrid wires associated with the first fishbone structure, (2) obtain a second set of nonlocal conductance values associated with each of the second set of hybrid wires associated with the second fishbone structure, (3) obtain a third set of nonlocal conductance values associated with each of the third set of hybrid wires associated with the third fishbone structure, and (4) obtain a fourth set of nonlocal conductance values associated with each of the fourth set of hybrid wires associated with the fourth fishbone structure.

15. The hybrid superconductor-semiconductor device of claim 14, wherein each of the first set of hybrid wires, the second set of hybrid wires, the third set of hybrid wires, and the fourth set of hybrid wires comprises end junctions, and wherein the measurement system is configured to obtain a set of local conductance values using the end junctions.

16. The hybrid superconductor-semiconductor device of claim 15, wherein the measurement system is further configured to allow determination of, by averaging the measured local conductance values, a set of disorder-averaged sub-band transitions in a plunger voltage associated with the hybrid superconductor-semiconductor device.

17. The hybrid superconductor-semiconductor device of claim 14, wherein the measurement system is further configured to: (1) independently determine an electrochemical potential associated with each of the first set of hybrid wires, (2) independently determine an electrochemical potential associated with each of the second set of hybrid wires, (3) independently determine an electrochemical potential associated with each of the third set of hybrid wires, and (4) independently determine an electrochemical potential associated with each of the fourth set of hybrid wires.

18. The hybrid superconductor-semiconductor device of claim 14, wherein: (1) a first set of plunger gates associated with the first fishbone structure share a first connection to the measurement system and a first set of helper gates associated with the first fishbone structure share a second connection to the measurement system, (2) a second set of plunger gates associated with the second fishbone structure share a third connection to the measurement system and a second set of helper gates associated with the second fishbone structure share a fourth connection to the measurement system, (3) a third set of plunger gates associated with the third fishbone structure share a fifth connection to the measurement system and a third set of helper gates associated with the third fishbone structure share a sixth connection to the measurement system, and (4) a fourth set of plunger gates associated with the fourth fishbone structure share a seventh connection to the measurement system and a fourth set of helper gates associated with the fourth fishbone structure share an eighth connection to the measurement system.

19. The hybrid superconductor-semiconductor device of claim 14, wherein the measurement system is further configured to extract an indicator of any variation in depletion voltages that are applied during measurement of the first set of nonlocal conductance values associated with the first set of hybrid wires, during measurement of the second set of nonlocal conductance values associated with the second set of hybrid wires, during measurement of the third set of nonlocal conductance values associated with the third set of hybrid wires, and during measurement of the fourth set of nonlocal conductance values associated with the fourth set of hybrid wires.

20. The hybrid superconductor-semiconductor device of claim 14, further comprising a first gap for splitting plunger gates associated with the first fishbone structure, a second gap for splitting plunger gates associated with the second fishbone structure, a third gap for splitting plunger gates associated with the third fishbone structure, and a fourth gap for splitting plunger gates associated with the fourth fishbone structure in order to make the hybrid superconductor-semiconductor device more robust against fabrication failures.

* * * * *